United States Patent
Kiriya (10) Patent No.: US 7,312,853 B2
(45) Date of Patent: Dec. 25, 2007

(54) EXPOSURE APPARATUS AND EXPOSING METHOD FOR ELASTICALLY DEFORMING A CONTACT MASK WITH CONTROL DATA

(75) Inventor: Shinobu Kiriya, Hadano (JP)

(73) Assignee: Canon Kabushiki Kaisha, Tokyo (JP)

(*) Notice: Subject to any disclaimer, the term of this patent is extended or adjusted under 35 U.S.C. 154(b) by 84 days.

(21) Appl. No.: 11/167,178

(22) Filed: Jun. 28, 2005

(65) Prior Publication Data
US 2006/0033896 A1 Feb. 16, 2006

(30) Foreign Application Priority Data
Jun. 29, 2004 (JP) ............................ 2004-192263

(51) Int. Cl.
*G03B 27/64* (2006.01)
*G03B 27/20* (2006.01)

(52) U.S. Cl. ............................ 355/76; 355/78; 430/5

(58) Field of Classification Search ................ 355/30, 355/72, 76, 78, 53, 75; 430/5, 20, 30
See application file for complete search history.

(56) References Cited

U.S. PATENT DOCUMENTS

| | | | |
|---|---|---|---|
| 4,335,999 A * | 6/1982 | Lamontagne et al. | ......... 417/38 |
| 6,171,730 B1 * | 1/2001 | Kuroda et al. | ................. 430/5 |
| 6,187,482 B1 | 2/2001 | Kuroda et al. | ................. 430/5 |
| 6,632,593 B2 | 10/2003 | Yamaguchi et al. | ........ 430/322 |
| 6,720,115 B2 | 4/2004 | Inao et al. | ..................... 430/5 |
| 7,001,696 B2 | 2/2006 | Inao et al. | ..................... 430/5 |
| 7,050,144 B2 | 5/2006 | Mizutani et al. | .............. 355/19 |
| 2004/0166421 A1 | 8/2004 | Yamaguchi et al. | ............ 430/5 |

* cited by examiner

*Primary Examiner*—Diane I. Lee
*Assistant Examiner*—Chia-how Michael Liu
(74) *Attorney, Agent, or Firm*—Fitzpatrick, Cella, Harper & Scinto (57) ABSTRACT

An exposure apparatus for exposing an object to be exposed by elastically deforming an exposing mask having a micro-opening pattern so as to bring the exposing mask into contact with the object includes a compression/decompression section for elastically deforming the exposing mask with compression/decompression so as to bring the exposing mask into contact with the object or into detachment from the object; and a controlling section for controlling the compression/decompression operation with the compression/decompression section. The controlling section controls the compression/decompression operation with the compression/decompression section based on control data prepared in advance.

32 Claims, 10 Drawing Sheets

EXPOSURE APPARATUS AND EXPOSING METHOD FOR ELASTICALLY DEFORMING A CONTACT MASK WITH CONTROL DATA

BACKGROUND OF THE INVENTION

1. Field of the Invention

The present invention relates to an exposure apparatus and an exposing method, and, in particular, relates to a light exposure performed in a state that an exposing mask having a micro-opening pattern is elastically deformed so as to come in contact with an object to be exposed.

2. Description of the Related Art

Recently, along with progress and diversification in lithographic techniques used for manufacturing semiconductor devices and optical devices, various exposing methods have been proposed as emerging lithographic techniques. Among them, an exposing method is proposed in that micro-fabrication is enabled across the light diffraction limit using nearfield light.

An exposure apparatus employing an exposing method using such nearfield light is proposed in that an exposing mask (membrane mask) made of an elastic body is elastically deformed so as to conform to a resist surface of the object for securely contacting the entire resist surface, and the exposure is made using the nearfield light (evanescent light) passing through the micro-opening pattern.

Such an exposure apparatus (evanescent-light exposure apparatus) using the nearfield light includes means for attaching/detaching the exposing mask to/from an object to be exposed. Such means may include a unit composed of high-pressure gas, a pressure control valve, and a pressurized vessel; and a unit composed of a piston drive motor, a piston, a cylinder, and a pressure control vessel (U.S. Pat. No. 6,171,730, U.S. Pat. No. 6,187,482).

In such a conventional exposure apparatus using the nearfield light, when the exposing mask is caused to contact the object or to detach therefrom, if a rapid compression or decompression is made under certain conditions, an impact load beyond an allowable load of the exposing mask, based on a pressure change applied to the mask, may be applied to the exposing mask.

When such an impact load is applied thereto, in addition to problems that the exposing mask is damaged and the life of the exposing mask is reduced, there are possibilities that the exposing mask naturally oscillates; accuracies in attaching/detaching are reduced due to non-smooth attaching/detaching between the exposing mask and the object; and difficulties in application to various exposing masks.

SUMMARY OF THE INVENTION

In an exposure apparatus for exposing an object to be exposed by elastically deforming an exposing mask having an opening pattern so as to bring the exposing mask into contact with the object, the exposure apparatus provided by the present invention includes compression/decompression means for elastically deforming the exposing mask with compression/decompression operation so as to bring the exposing mask into contact with the object or to effect separation of the exposing mask from the object; and controlling means for controlling the compression/decompression means to effect the compression/decompression operation, in which the controlling means controls the compression/decompression means to effect the compression/decompression operation based on control data prepared in advance.

An exposing method provided by the present invention includes the steps of preparing an exposure apparatus, having an exposure light source, an exposing mask, and a pressure regulating vessel for holding the exposing mask, for exposing an object to be exposed by controlling the pressure in the pressure regulating vessel so as to elastically deform the exposing mask and to bring the exposing mask into a contact state with the object; and controlling the contact state between the exposing mask and the object by a compression/decompression operation of the pressure regulating vessel, in which the compression/decompression operation is performed based on control data prepared in advance.

In an exposure apparatus for exposing an object to be exposed by elastically deforming an exposing mask having an opening pattern so as to bring the exposing mask into contact with the object, the exposure apparatus provided by the present invention includes a pressure regulating vessel that elastically deforms the exposing mask in a compression/decompression operation so as to bring the exposing mask into contact with the object or to effect separation of the exposing mask from the object; and a controller that controls the pressure regulating vessel to effect the compression/decompression operation. The controller controls the pressure regulating vessel to effect the compression/decompression operation based on control data prepared in advance.

According to the present invention, by controlling the compression/decompression operation with the compression/decompression means based on control data prepared in advance so as to reduce the impact load on the exposing mask due to the rapid compression/decompression, the optimum compression/decompression control of the exposing mask is enabled, reducing the impact load on the exposing mask due to the rapid compression/decompression. Furthermore, the attachment and detachment with extreme smoothness and high accuracy can be achieved, and the natural frequency range of the exposing mask can be avoided.

Further features and advantages of the present invention will become apparent from the following description of exemplary embodiments with reference to the attached drawings.

DESCRIPTION OF THE EMBODIMENTS

Figure 1:
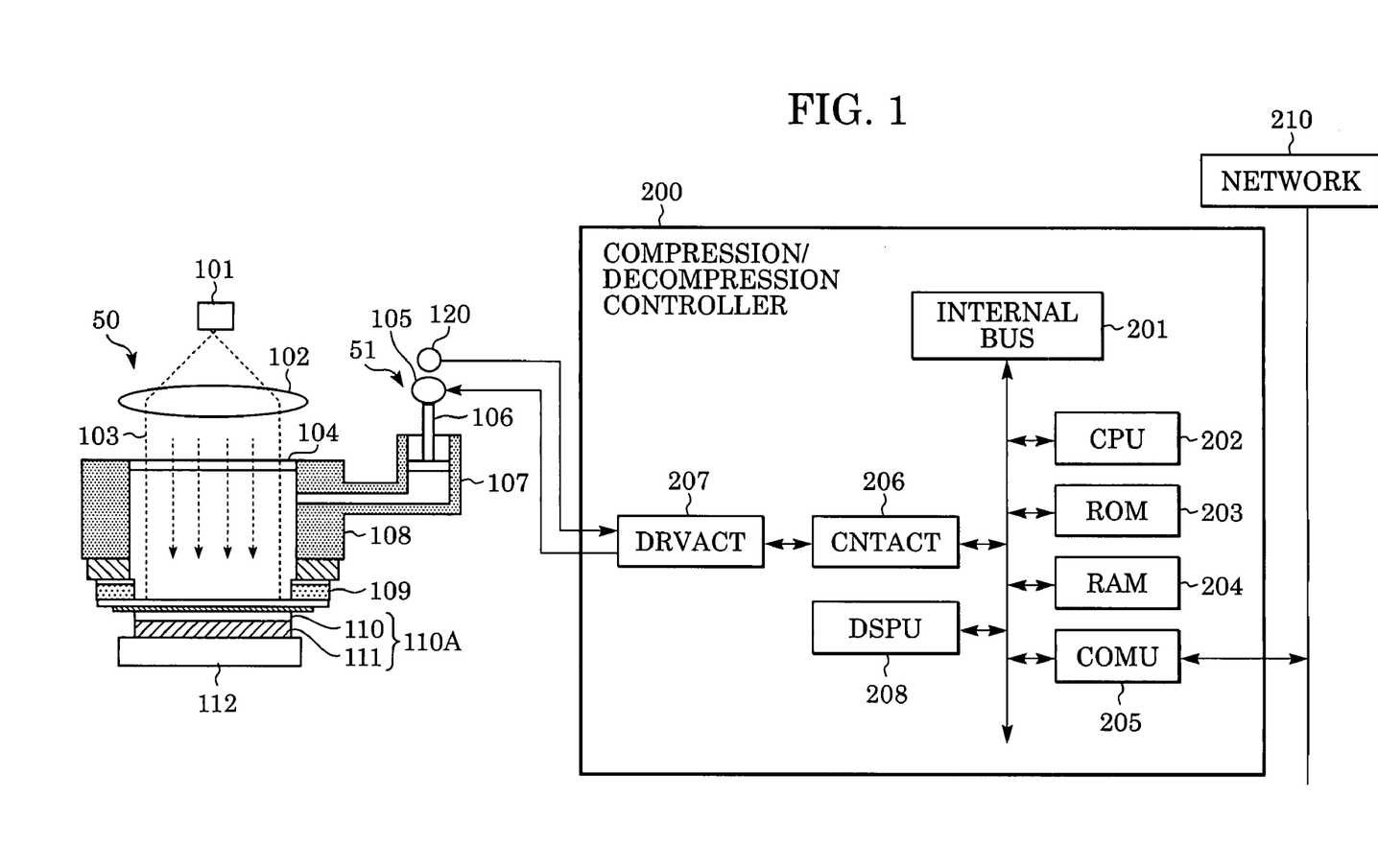
FIG. 1 is a schematic structural view of an exposure apparatus according to an embodiment of the present invention.

FIG. 1 is a schematic structural view of an exposure apparatus according to an embodiment of the present invention. Referring to FIG. 1, a nearfield exposure apparatus 50 includes a pressure regulating vessel 108, an exposure light source 101, a stage 112, and a compression/decompression actuator 51 for regulating the pressure in the pressure regulating vessel 108.

Figure 2A:
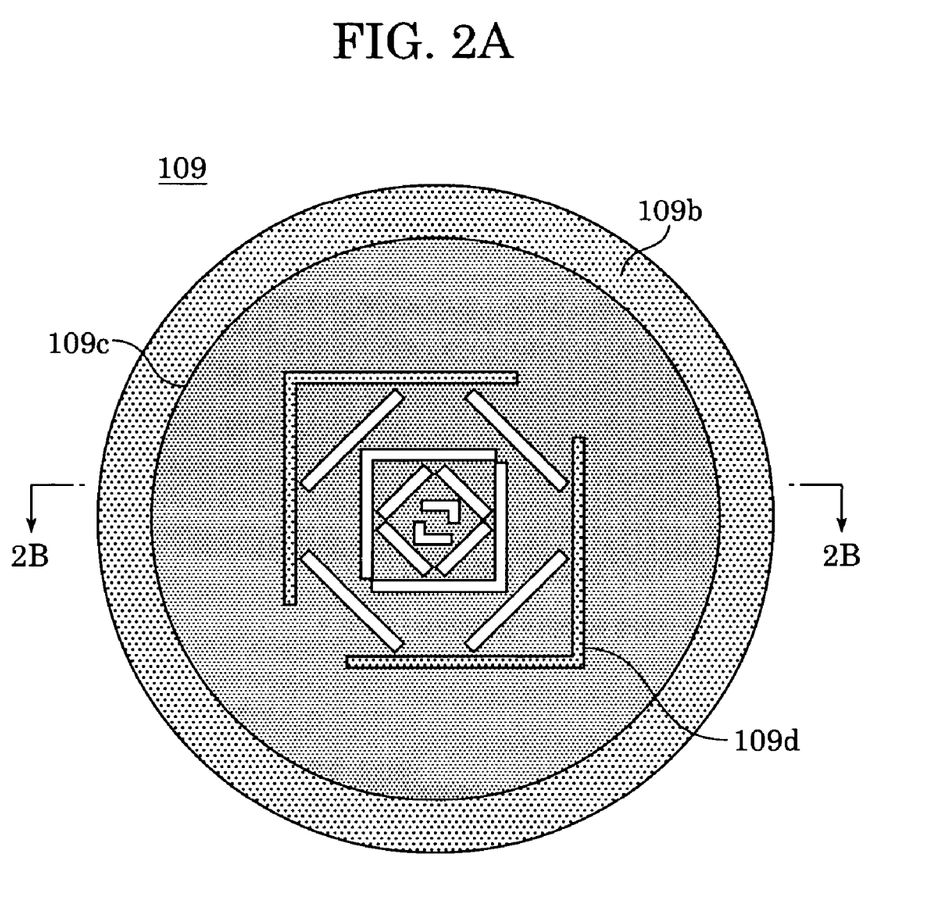
FIG. 2A is a plan view for illustrating an exposing mask provided in the exposure apparatus.
Figure 2B:
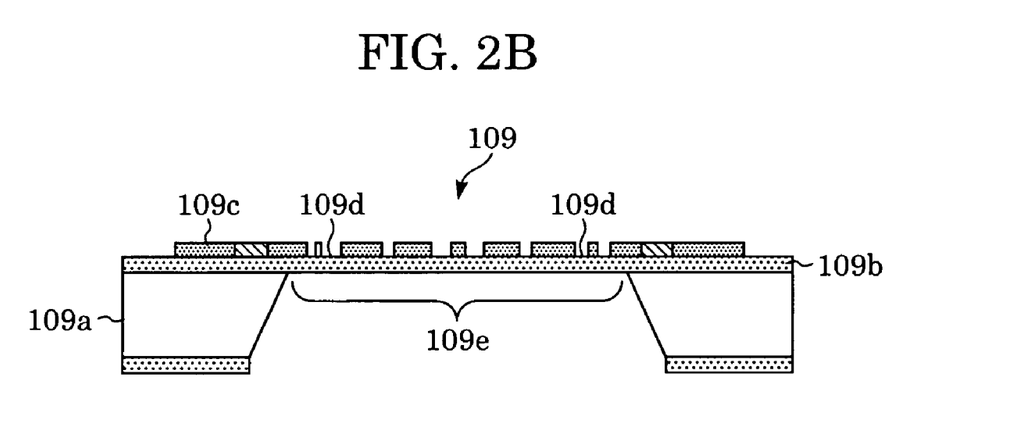
FIG. 2B is a cross-sectional view of FIG. 2A taken along section line 2B-2B.

Also, in FIG. 1, an exposing mask 109 is attached on the bottom surface of the pressure regulating vessel 108. The exposing mask 109, as shown in FIGS. 2A and 2B, is composed of a mask support 109a, a mask base material 109b, and a light-exclusion film 109c. The light-exclusion film 109c is formed on the mask base material 109b, made of an elastic body for holding the thin film, so as to be retained thereon. The light-exclusion film 109c is provided with micro-openings 109d formed to have a desired pattern.

The exposing mask 109 is provided with an elastically deformable thin-film portion 109e formed in the central part and not overlapping the mask support 109a. In the description below, the surface of the exposing mask 109 shown in FIG. 2A and having the light-exclusion film 109c formed thereon is referred to as the front surface, and the surface opposite thereto is referred to as the back surface. The exposing mask 109 is also attached on the bottom surface of the pressure regulating vessel 108 with the mask support 109a therebetween.

Referring to FIG. 1, an object to be exposed 110A is attached on the stage 112 movable in two-dimensional directions in the plane of the mask surface and in a direction normal to the mask surface. The object to be exposed 110A is composed of a substrate 111 and a resist 110 formed on the substrate 111. By driving the stage 112 having the object 110A attached thereon, the substrate 111 is positioned relatively to the exposing mask 109 in the two-dimensional directions in the plane of the mask surface, and then the stage 112 is moved in the direction normal to the mask surface.

In FIG. 1, a collimator lens 102 collimates exposure light 103 emitted from the exposure light source 101. The exposure light 103 collimated by the collimator lens 102 is directed inside the pressure regulating vessel 108 after passing through a glass window 104 arranged on the upper surface of the pressure regulating vessel 108.

Next, an exposing method in the nearfield exposure apparatus 50, constructed as described above, will be described.

First, the exposing mask 109 is attached on the bottom surface of the pressure regulating vessel 108 so that the surface of the mask faces the object to be exposed 110A. Then, the object 110A is attached on the stage 112, and by driving the stage 112, the substrate 111 is positioned relatively to the exposing mask 109 in the two-dimensional directions in the plane of the mask surface, and thereafter the substrate 111 is moved in the direction normal to the mask surface so as to be a predetermined distance from the exposing mask 109.

Then, a fluid (gas or liquid) is fed into the pressure regulating vessel 108 with the compression/decompression actuator 51, and by applying pressure to the surface of the exposing mask 109 from the back surface thereof, the thin-film portion 109e of the exposing mask 109 is elastically deformed (distorted) so as to attach (bring into contact with) the exposing mask 109 to the object 110A so as to have a space of 100 nm or less between the surface of the exposing mask 109 and the resist surface 110 of the substrate 111 along the entire surface.

After the exposing mask 109 securely contacts the object 110A in such a manner, the exposure light 103 emitted from the exposure light source 101 and then collimated by the collimator lens 102 is directed through the pressure regulating vessel 108 so as to irradiate the back surface of the exposing mask 109. Thereby, nearfield light is directed through a micro-opening pattern formed on the light-exclusion film 109c of mask base material 109b of the exposing mask 109, and the exposure is effected using the nearfield light.

Then, after completion of such an exposure process, the pressure regulating vessel 108 is degassed so as to equalize the pressure with the outside thereof. Thereby, the distortion of the exposing mask 109 is released so that the exposing mask 109 is detached from the object 110A. At this time, if a suction force exists between the exposing mask 109 and the object 110A, the exposing mask 109 may not be detached from the object 110A even when the pressure regulating vessel 108 is equalized in pressure with the outside. In this case, by reducing the pressure of the pressure regulating vessel 108 lower than that of the outside, the exposing mask 109 is deformed upward in the drawing so as to increase the detaching force.

With these processes, the exposure process is completed so as to expose the object 110A to be able to have a desired pattern.

The compression/decompression actuator 51 for feeding gas into the pressure regulating vessel 108 may include a unit having a cylinder, a piston, and a piston drive motor with an encoder, a unit having a high-pressure gas source and a pressure regulating valve, or a unit having a high-pressure gas source and a servo valve. The compression/decompression actuator 51 according to the embodiment, as shown in FIG. 1, includes a cylinder 107 communicating with the pressure regulating vessel 108, a piston 106 for feeding gas into the pressure regulating vessel 108, and a motor 105 with encoder 120 for driving the piston 106. The unit having a cylinder, a piston, and a piston drive motor with an encoder herein is exemplified for description; however, the unit having a high-pressure gas source and a pressure regulating valve or the unit having a high-pressure gas source and a servo valve may alternatively be incorporated therein.

Referring to FIG. 1, a compression/decompression controller 200 controls the compression/decompression operation of the compression/decompression actuator 51. By controlling the compression/decompression operation of the compression/decompression actuator 51 for elastically deforming the exposing mask 109 so as to bring it into contact with the object 110A or to detach it therefrom with the compression/decompression controller 200, the pressure applied to the exposing mask 109 is optimized. Thereby, the attachment/detachment of the exposing mask 109 to/from the object 110A can be performed under the most effective conditions.

The compression/decompression controller 200 includes a CPU 202, a ROM 203 storing a compression/decompression control program for the exposure mask, a communication processor (COMU) 205, a RAM 204 temporarily storing control data fed from the outside via a network 210, a compression/decompression actuator controller (CNTACT) 206 driving the piston drive motor 105 via a compression/decompression actuator driver (DRVACT) 207, and an internal bus 201.

During the exposure operation in the compression/decompression controller 200 constructed as above, the CPU 202 temporarily stores control data fed from the outside via the communication processor (COMU) 205 connected to the internal bus 201 into the RAM 204 based on the compression/decompression control program for the exposure mask stored in the ROM 203 connected to the internal bus 201.

This control data controls the compression/decompression actuator 51 for reducing the impact load on the exposing mask 109 due to the rapid compression/decompression as well as for improving the attachment and detachment smoothness and the attachment and detachment accuracy by avoiding the natural frequency range of the exposing mask 109 so as to achieve the optimum compression/decompression profile for the exposure mask obtained from experiments and computer simulation analyses.

Then, the control data is developed into a control data table of the compression/decompression actuator controller 206 so as to store it therein. Thereafter, the compression/decompression actuator controller 206 commands the compression/decompression actuator driver 207 to control the internal pressure of the pressure regulating vessel 108 by driving the piston drive motor 105. Thereby, the exposing mask 109 is displaced (elastically deformed) in a predetermined manner so as to attach to the object 110A or detach therefrom.

According to the present invention, the control data prepared in advance is not limited to the data stored in the data table, and may also include data produced based on a function prepared in advance.

Next, the embodiment will be described further in detail by exemplifying an example.

Figure 3:
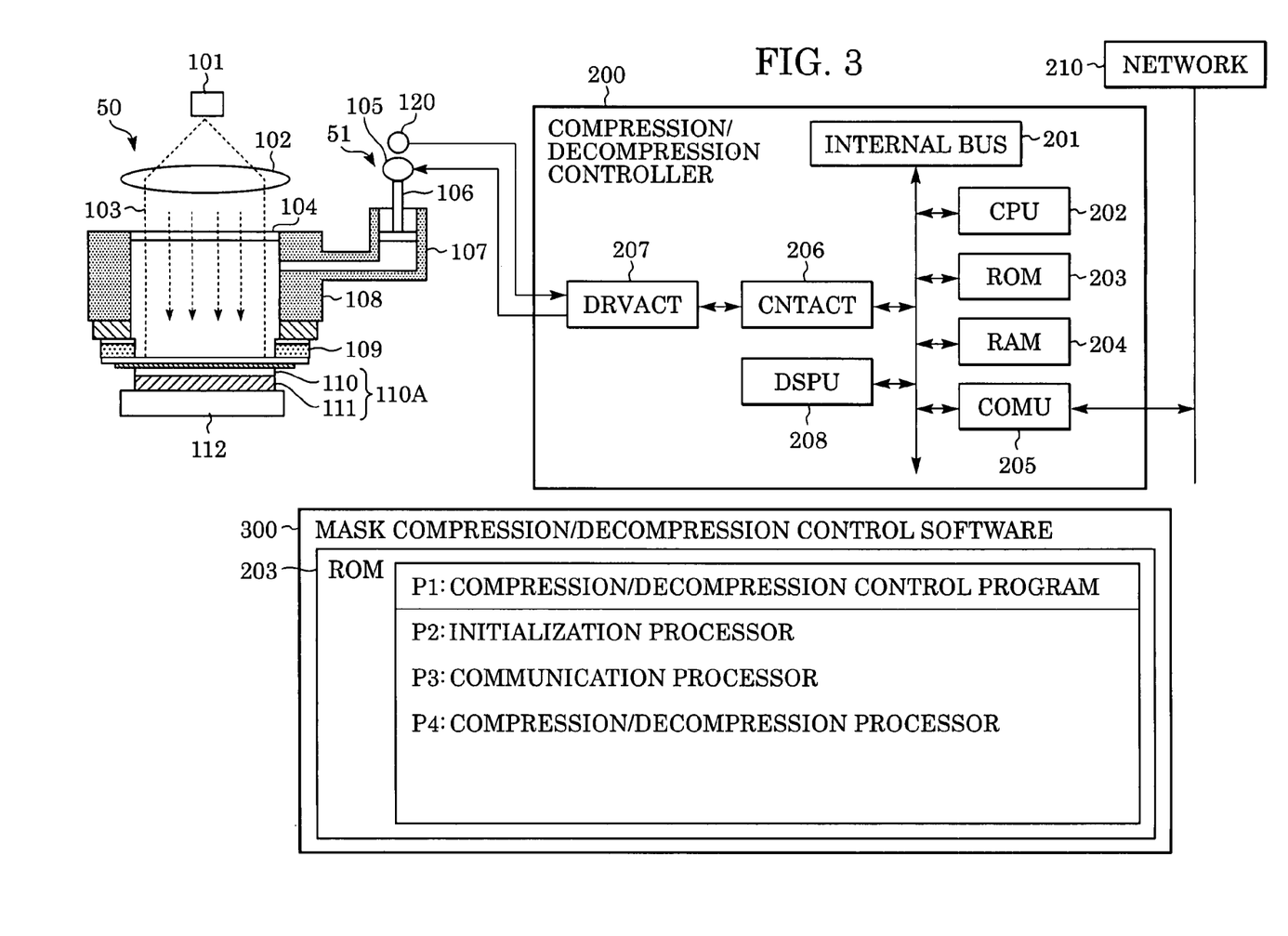
FIG. 3 is a drawing showing a specific configuration for controlling the compression/decompression profile of the exposing mask in the exposure apparatus according to the embodiment of the present invention.

FIG. 3 shows a specific structure of the exposure apparatus according to the embodiment for executing the compression/decompression profile for the exposure mask. In the compression/decompression actuator 51, a velocity loop and a position loop are formed with the piston drive motor 105, the encoder 120 for detecting the velocity and the position, and the compression/decompression actuator driver 207. According to the embodiment, from the present rotational position information obtained from the signal of the encoder 120, the positional information of the piston drive motor 105 is detected, and the pressure of the pressure regulating vessel 108 is further detected from the positional information of the piston 106, which correlates to the positional information of the piston drive motor 105.

Figure 4:
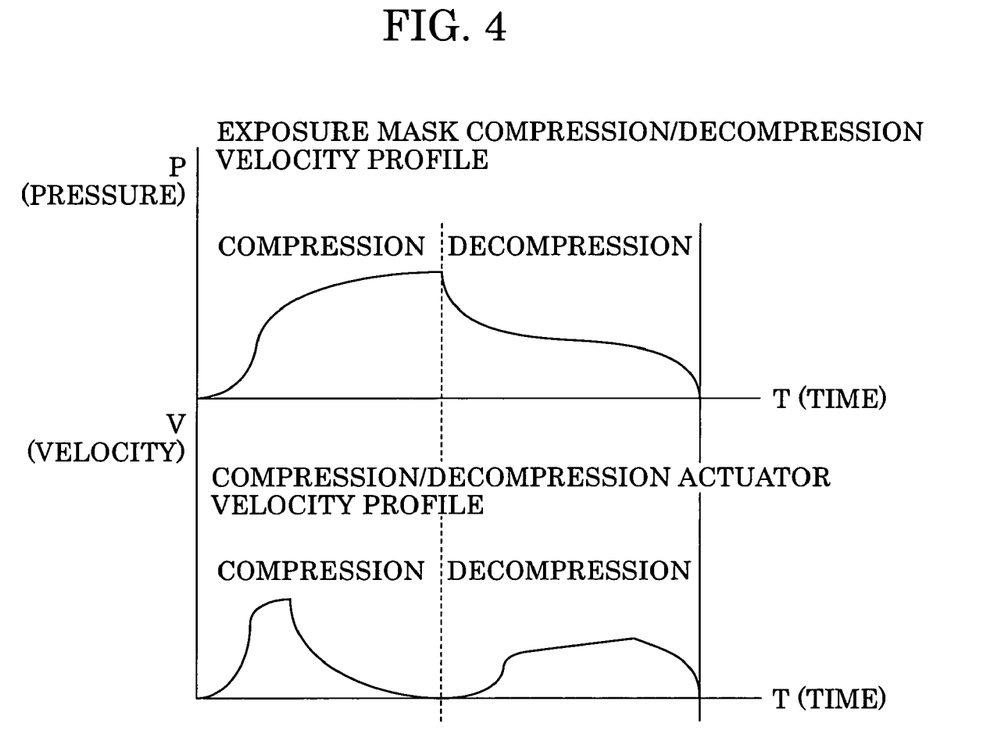
FIG. 4 depicts compression/decompression actuator drive velocity profiles during compression and during decompression in the exposure apparatus and resultant pressure profiles inside a pressure regulator.

FIG. 4 shows examples of a velocity profile of the compression/decompression actuator drive (rotation and linear motion) during compression and decompression and the resultant pressure profile in the pressure regulator. During exposure, by controlling the compression/decompression actuator 51 so as to achieve such profiles, the impact load on the exposing mask 109 can be reduced during compression and decompression. Simultaneously, the attachment and detachment can be very smoothly performed with high accuracy and the natural frequency can be avoided, resulting in prevention of the exposing mask 109 from being damaged and an increase in the life thereof.

In FIG. 3, reference numeral 300 denotes exposing mask compression and decompression control software, wherein an exposing mask compression and decompression control program P1 stored in the ROM 203 has an initialization processor P2, a communication processor P3, and a compression and decompression processor P4.

Figure 5:
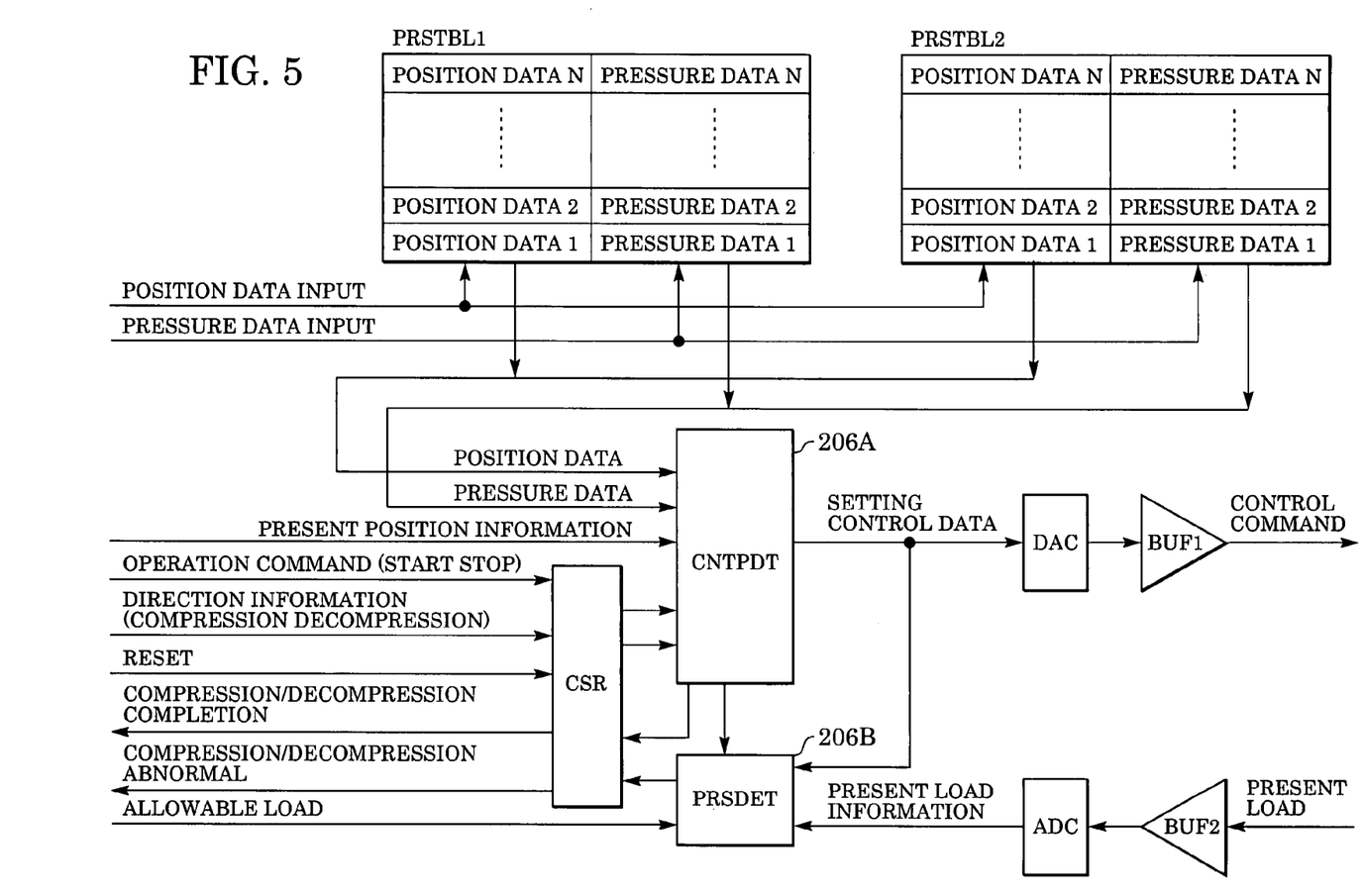
FIG. 5 is a block diagram of a compression/decompression actuator controller provided in the exposure apparatus.

FIG. 5 is a block diagram of the compression/decompression actuator controller 206 having a first control data table PRSTBL1 storing the control data during compression and a second control data table PRSTBL2 storing the control data during decompression.

The compression/decompression actuator controller 206 also includes a CNTPDT 206A producing setting control data as a control command corresponding to the present positional information from the encoder 120, the positional and pressure data of the first and second control data tables PRSTBL1 and PRSTBL2, and the operation command (start and stop) and the directional information (compression and decompression) from a control state register (CSR).

The operation of the compression/decompression controller 200 according to the embodiment will be described below.

Figure 6:
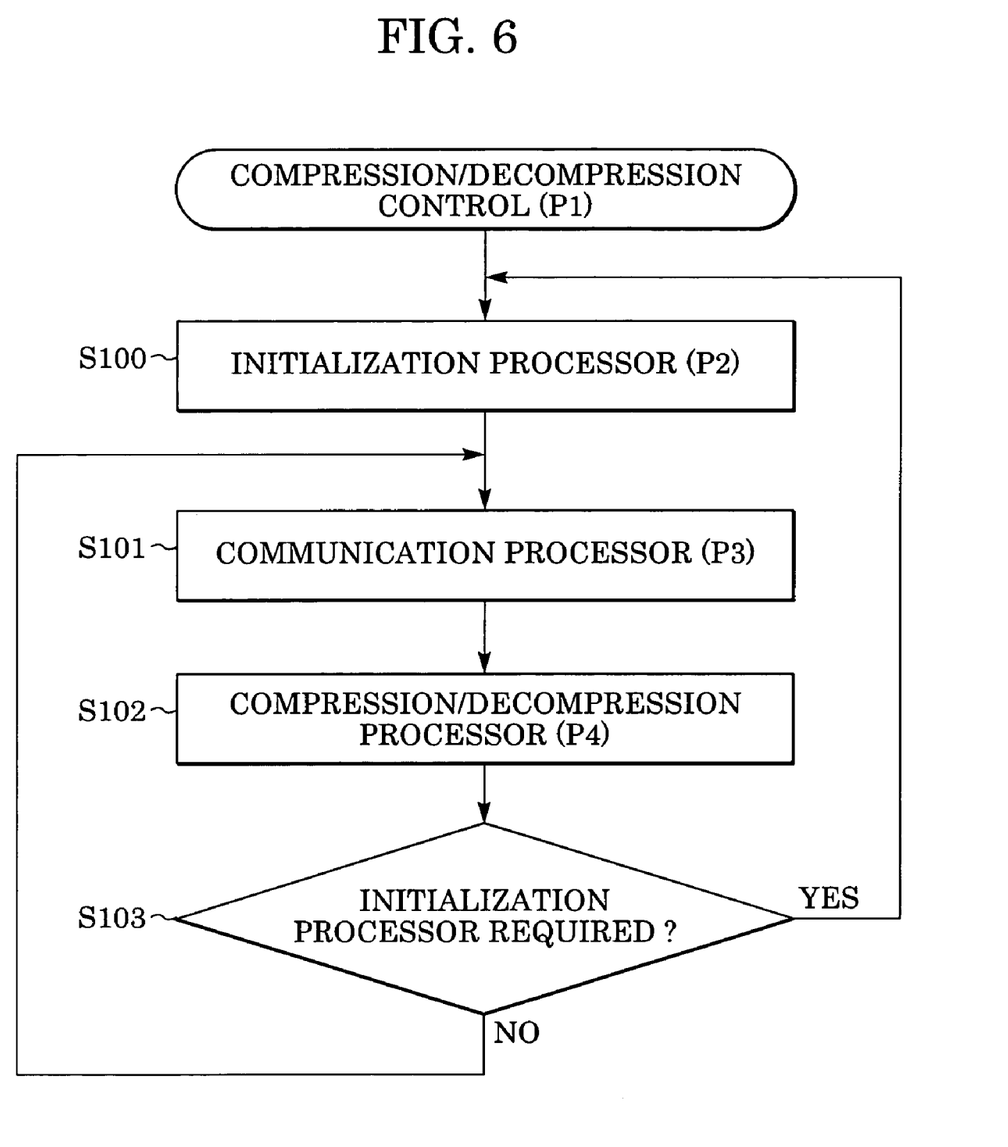
FIG. 6 is a flowchart of a compression/decompression control program of the exposing mask executed by the compression/decompression actuator controller.

When the power supply of the system is turned on by the CPU 202 of the compression/decompression controller 200, among the exposing mask compression and decompression control software 300 shown in FIG. 3, the exposing mask compression and decompression control program P1 stored in the ROM 203 is executed. In the exposing mask compression and decompression control program P1, first, as shown in the flowchart of FIG. 6, the initialization processor P2 is started (Step S100); then, the communication processor P3 is started (Step S101); and thereafter, the compression and decompression processor P4 is started (Step S102). Moreover, then, the necessity of the initialization procession is determined (Step S103); if it is required (Yes in Step S103), the process is returned to Step S100, and if it is not required (No in Step S103), the process is returned to Step S101

Figure 7:
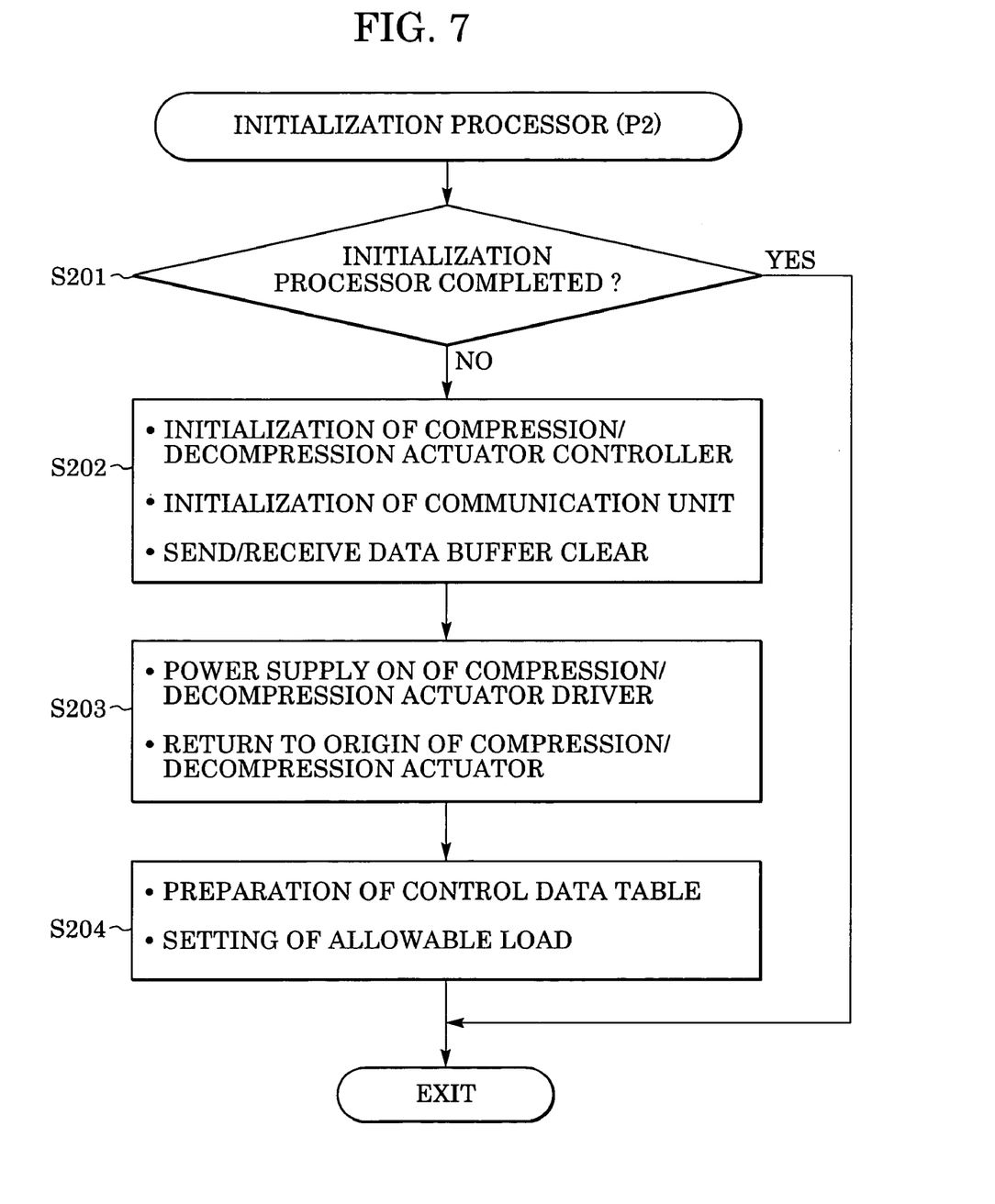
FIG. 7 is a flowchart of an initialization processor of the compression/decompression control program.

Upon starting the initialization processor P2, as shown in the flowchart of FIG. 7, it is determined whether the initialization procession is completed (Step S201), and if it is not completed (No in Step S201), the control state register (CSR) of the compression/decompression actuator controller 206 and the communication processor 205 are initialized and the transmitted and received data buffer of the RAM 204 is cleared (Step S202).

Then, the power supply of the compression/decompression actuator driver 207 is turned on while a command is fed to the compression/decompression actuator driver 207 so as to return the compression/decompression actuator 51 to the original position (initial position) (Step S203).

Then, into the first and second control data tables PRSTBL1 and PRSTBL2 (see FIG. 5), the control data is stored based on the external control data or the information stored in the RAM 204 so as to prepare the control data table as well as to establish an allowable load value in a fault detection register (PRSDET) 206B (see FIG. 5). As above, the initialization processor P2 is completed.

Figure 8:
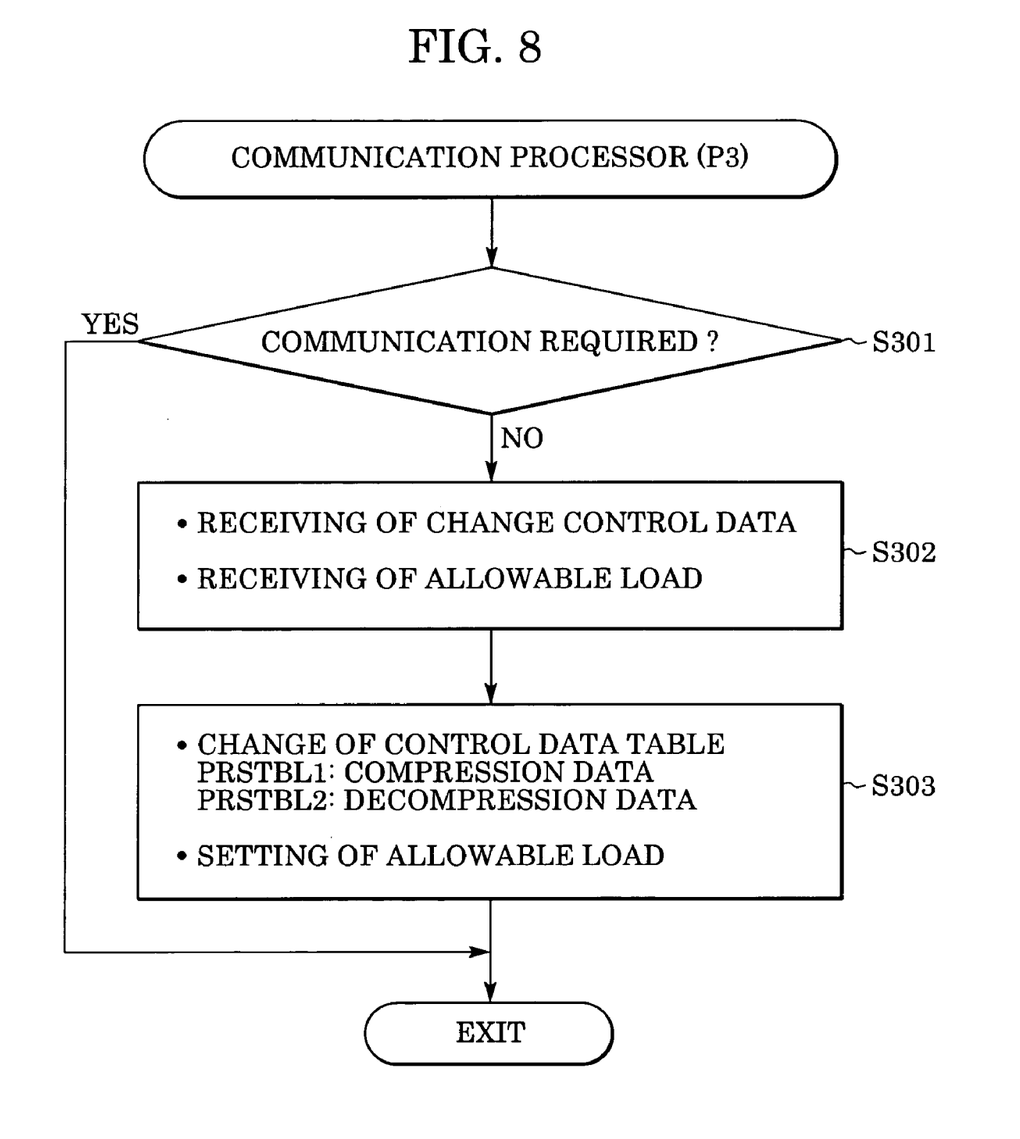
FIG. 8 is a flowchart of a communication processor of the compression/decompression control program.

Next, the communication processor P3, as shown in the flowchart of FIG. 8, determines whether the communication is required from the status of the communication processor 205. If it is not (No in Step S301), the communication processor P3 is completed, and if it is (Yes in Step S301), it executes the next process.

That is, if the communication requirement is a requirement regarding changes of the control data raised along with the change of the exposing mask 109, the change control data and the allowable load value are received from the outside or the RAM 204 (Step S302) so as to change the control data table and the fault detection register. Specifically, the first and second control data tables PRSTBL1 and PRSTBL2 are changed and the allowable load value is established.

Figure 9A:
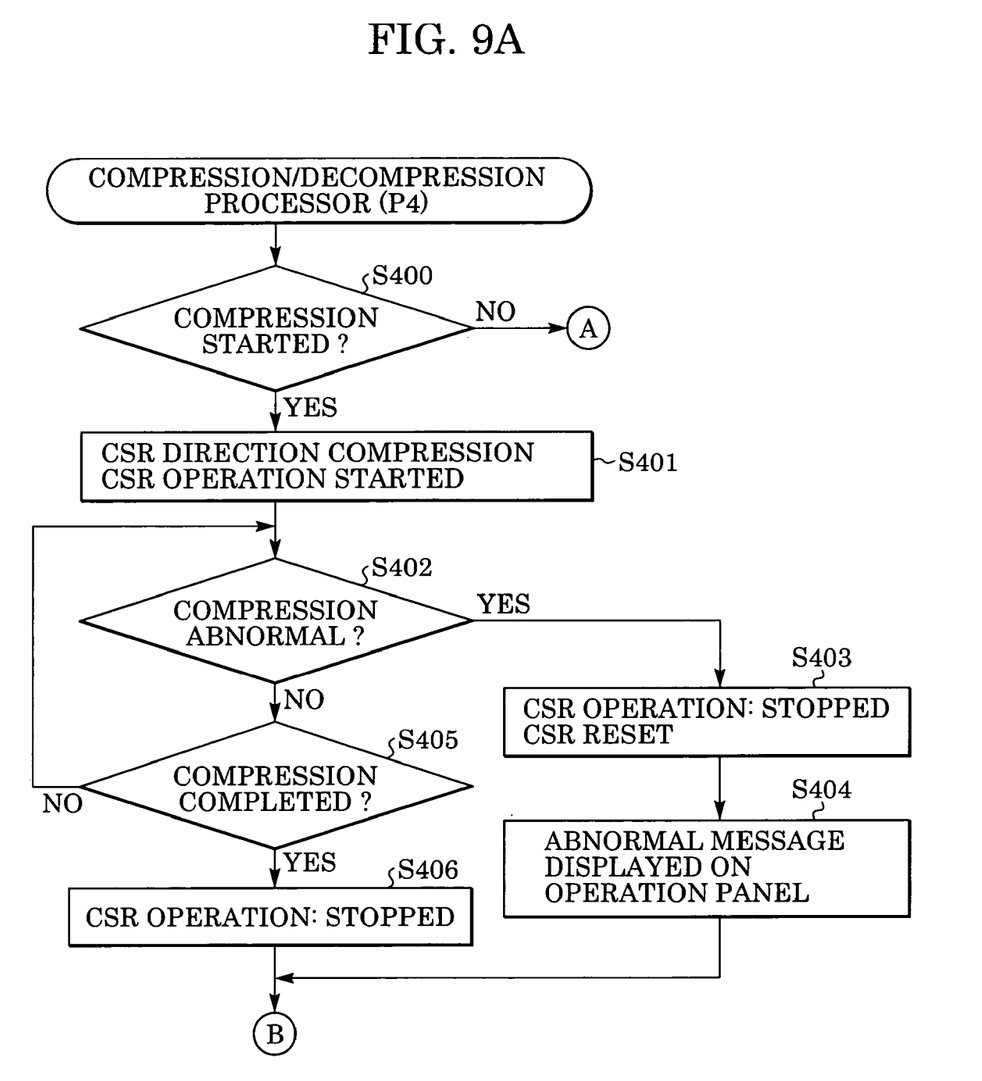
FIGS. 9A and 9B are flowcharts of a compression/decompression processor of the compression/decompression control program.
Figure 9B:
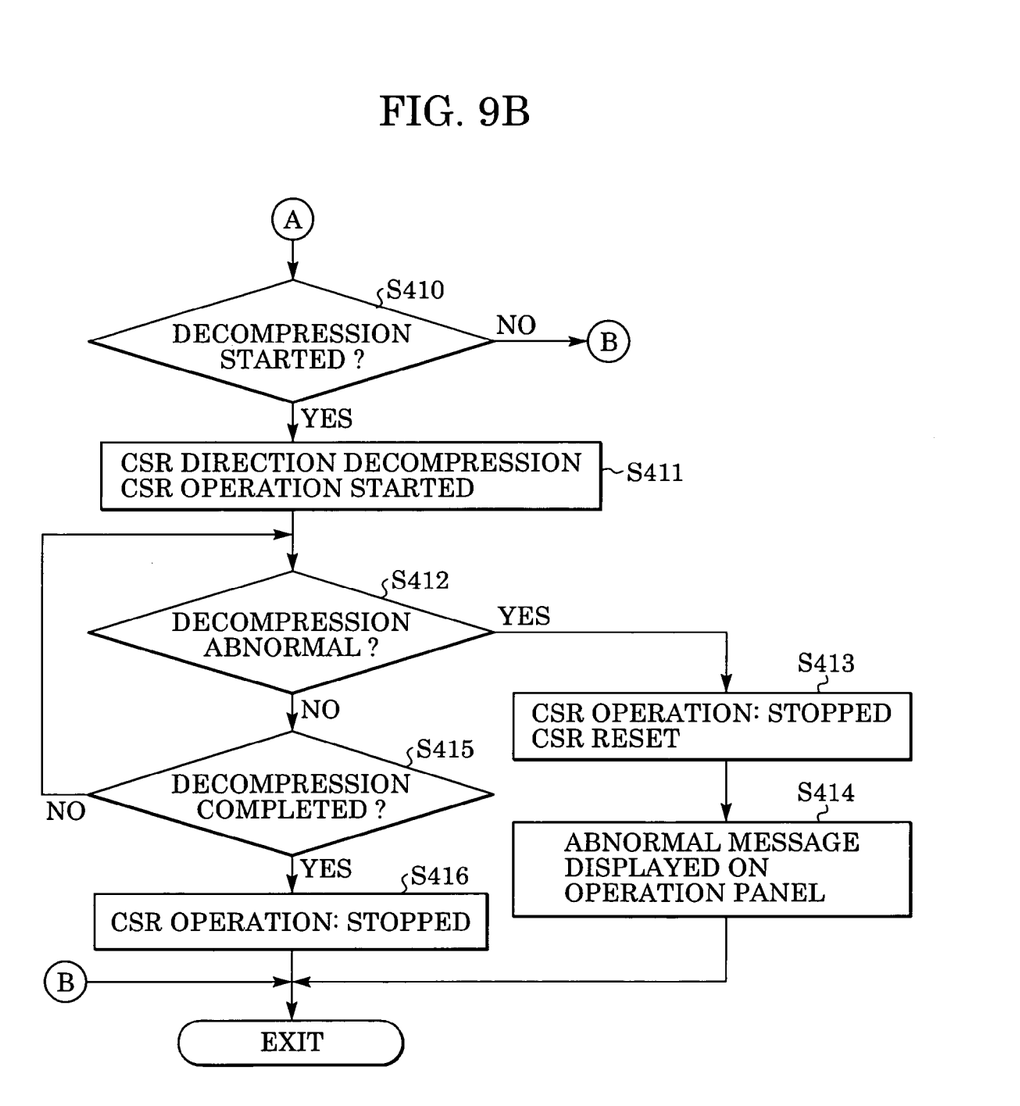

Then, when the compression is started (Yes in Step S400), the compression and decompression processor P4, as shown in the flowcharts of FIGS. 9A and 9B, starts the operation command (start and stop) of the control state register (CSR) of the compression/decompression actuator controller 206 shown in FIG. 5 so as to establish the directional information (compression and decompression) bit into the compression (Step S401).

Then, the compression/decompression actuator controller 206 commands the compression/decompression actuator driver 207 to control the compression, so that the compression/decompression actuator driver 207 drives the compression/decompression actuator 51 so as to increase the internal pressure of the pressure regulating vessel 108. With increasing internal pressure of the pressure regulating vessel 108, the exposing mask 109 is elastically deformed toward the object.

At this time, the present positional information transmitted from the encoder 120 via the compression/decompression actuator driver 207 is compared with the positional data of the compression control data table PRSTBL1 during compression or the elapsed time. According to the embodiment, by comparing the positional data, for example, the control data (pressure data) corresponding to the positional data coinciding therewith is derived so as to feed it to the compression/decompression actuator driver 207 as a setting control command.

The compression/decompression actuator driver 207 changes the operation velocity of the compression/decompression actuator 51 by this setting so as to change the internal pressure of the pressure regulating vessel 108. Along with this, as shown in the compression/decompression profile for the exposure mask during compression corresponding to the velocity profile of the compression/decompression actuator shown in FIG. 4, the internal pressure of the pressure regulating vessel 108 is increased.

During such compression, the fault detection register 206B of the compression/decompression actuator controller 206 reads out the present load from the compression/decompression actuator driver 207 and determines the presence of compression fault by comparing it with the allowable load value as well (Step S402). If the present load is larger than the allowable load value, it is determined to be the compression fault (Yes in Step S402) so that the compression/decompression actuator 51 is returned to the original point (toward the decompression) so as to stop the operation of the control state register as well as to reset the control state register (Step S403). Furthermore, a message indicating the fault is displayed on a display unit DSPU 208 of an operation panel (Step S404).

When there is no compression fault (No in Step S402) and the compression is normally completed thereafter (Yes in Step S405), the operation of the control state register of the compression/decompression actuator 51 is stopped (Step S406) so as to maintain the pressure.

On the other hand, when the exposure is performed in this state and the decompression is started thereafter (Yes in Step S410), the operational command (start, stop) bit of the control state register (CSR) of the compression/decompression actuator controller 206 shown in FIG. 5 is started so as to establish the directional information (compression and decompression) bit into the decompression (Step S411). Then, the compression/decompression actuator controller 206 commands the compression/decompression actuator driver 207 to control decompression so as to decrease the internal pressure of the pressure regulating vessel 108.

At this time, the present positional information transmitted from the encoder 120 via the compression/decompression actuator driver 207 is compared with the positional data of the control data table PRSTBL2 during decompression so as to derive the control data (pressure data) corresponding to the coinciding positional data and to feed it to the compression/decompression actuator driver 207 as a setting control command.

By this setting, the compression/decompression actuator driver 207 changes the operational velocity of the compression/decompression actuator 51 and the internal pressure of the pressure regulating vessel 108. Along with this, the internal pressure of the pressure regulating vessel 108 is decreased as shown in the profile during decompression of the compression/decompression profile for the exposure mask corresponding to the velocity profile of the compression/decompression actuator shown in FIG. 4.

During such decompression, the fault detection register of the compression/decompression actuator controller 206 reads out the present load from the compression/decompression actuator driver 207 and compares it with the allowable load value so as to determine the presence of the fault decompression (Step S412). If the present load is larger than the allowable load value, it is determined to be the decompression fault (Yes in Step S412) so as to stop the operation of the control state register as well as to reset the control state register (Step S413). Furthermore, a message indicating the fault is displayed on a display unit DSPU 208 of an operation panel (Step S414).

When there is no decompression fault (No in Step S412) and the decompression is normally completed thereafter (Yes in Step S415), the operation of the control state register of the compression/decompression actuator 51 is stopped (Step S416) so as to maintain the pressure. Thereby, the compression and decompression processor P4 is completed so as to be in a standby state for starting the compression/decompression again and to repeat the compression/decompression sequence.

By such a compression/decompression controller 200, the compression/decompression operation with the compression/decompression actuator 51 is controlled based on the control data table prepared in advance so as to reduce the impact load on the exposing mask 109 due to the rapid compression/decompression. Thereby, the optimum compression/decompression control of the exposing mask 109 is enabled, reducing the impact load on the exposing mask 109 due to the rapid compression/decompression.

By controlling the compression/decompression operation with the compression/decompression actuator 51 based on the control data table prepared in advance, the natural frequency of the exposing mask 109 can be avoided. Furthermore, the attachment and detachment smoothness between the exposing mask 109 and the object 110A and the attachment and detachment accuracy therebetween can be improved.

Moreover, the compression/decompression controller 200 compares the allowable load of the exposing mask 109 with the pressure data of the control data table during the compression/decompression operation with the compression/decompression actuator 51. When the pressure data of the control data table is determined to exceed the allowable load of the exposing mask 109, the exposing mask 109 is prevented from being damaged by stopping the compression/decompression operation with the compression/decompression actuator 51.

When the allowable load of the exposing mask 109 is established to avoid the natural frequency of the exposing mask 109, by comparing the allowable load of the exposing mask 109 with the pressure data of the control data table, the natural frequency of the exposing mask 109 can be avoided.

In other words, by setting the allowable load of the exposing mask 109 to have a value within a predetermined range of the elastic deformation of the exposing mask 109, or to have a value that can avoid the natural frequency of the exposing mask 109, the exposing mask 109 is prevented from being damaged or the natural frequency of the exposing mask 109 can be avoided.

As described above, by setting the control data table and the allowable load of the exposing mask 109 to be changeable, various kinds of the exposing masks 109 can be utilized by changing the control data table and the allowable load of the exposing mask 109 from the outside via communication means, so that mass production can be enabled.

While the present invention has been described with reference to exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

This application claims priority from Japanese Patent Application No. 2004-192263 filed Jun. 29th, 2004, which is hereby incorporated by reference herein.

What is claimed is:

1. An exposure apparatus for exposing an object to be exposed by elastically deforming an exposing mask having an opening pattern so as to bring the exposing mask into contact with the object, the exposure apparatus comprising:
   compression/decompression means for elastically deforming the exposing mask in a compression/decompression operation so as to bring the exposing mask into contact with the object or to effect separation of the exposing mask from the object; and
   controlling means for controlling said compression/decompression means to effect the compression/decompression operation,
   wherein said controlling means controls said compression/decompression means to effect the compression/decompression operation based on control data prepared in advance for producing a predetermined compression profile in an exposing mask contacting operation and a predetermined decompression profile in an exposing mask separating operation,
   wherein said controlling means compares an allowable load of the exposing mask with a present load during the compression/decompression operation, and if the present load is determined to exceed the allowable load of the exposing mask, the compression/decompression operation is stopped, and
   wherein the allowable load of the exposing mask is within at least one of a predetermined range of the elastic deformation of the exposing mask and a range that would avoid a natural frequency of the exposing mask.

2. The apparatus according to claim 1, wherein the control data and the allowable load of the exposing mask are changeable.

3. The apparatus according to claim 1, wherein the control data and the allowable load of the exposing mask are changeable by an external source via communication means.

4. The apparatus according to claim 1, wherein when said controlling means determines that the present load exceeds the allowable load of the exposing mask, said controlling means controls displaying means to display that the present load exceeds the allowable load of the exposing mask.

5. The apparatus according to claim 1, wherein the opening pattern of the exposing mask comprises a micro-opening pattern.

6. The apparatus according to claim 1, wherein the control data is stored in a data table.

7. An exposing method comprising the steps of:
   providing an exposure apparatus, having an exposure light source, an exposing mask, and a pressure regulating vessel for holding the exposing mask, for exposing an object to be exposed by controlling the pressure in the pressure regulating vessel so as to elastically deform the exposing mask and to bring the exposing mask into a contact state with the object; and
   controlling the contact state between the exposing mask and the object by a compression/decompression operation of the pressure regulating vessel,
   wherein (i) the compression/decompression operation is performed based on control data prepared in advance for producing a predetermined compression profile in an exposing mask contacting operation and a predetermined decompression profile in an exposing mask separating operation, (ii) an allowable load of the exposing mask is compared with a present load during the compression/decompression operation, and (iii) if the present load is determined to exceed the allowable load of the exposing mask, the compression/decompression operation is stopped, and
   wherein the allowable load of the exposing mask is within at least one of a predetermined range of the elastic deformation of the exposing mask and a range that would avoid a natural frequency of the exposing mask.

8. The method according to claim 7, wherein the control data is stored in a data table.

9. The method according to claim 7, further comprising the step of changing the control data and the allowable load of the exposing mask.

10. The method according to claim 7, wherein when the present load is determined to exceed the allowable load of the exposing mask, said controlling step controls a display to display that the present load exceeds the allowable load of the exposing mask.

11. An exposure apparatus for exposing an object to be exposed by elastically deforming an exposing mask having an opening pattern so as to bring the exposing mask into contact with the object, the exposure apparatus comprising:
   a pressure regulating vessel that elastically deforms the exposing mask in a compression/decompression operation so as to bring the exposing mask into contact with the object or to effect separation of the exposing mask from the object; and
   a controller that controls said pressure regulating vessel to effect the compression/decompression operation,
   wherein said controller controls said pressure regulating vessel to effect the compression/decompression operation based on control data prepared in advance for producing a predetermined compression profile in an exposing mask contacting operation and a predetermined decompression profile in an exposing mask separating operation, and
   said controller compares an allowable load of the exposing mask with a present load during the compression/decompression operation, and if the present load is determined to exceed the allowable load of the exposing mask, the compression/decompression operation is stopped, and wherein the allowable load of the exposing mask is within at least one of a predetermined range of the elastic deformation of the exposing mask and a range that would avoid a natural frequency of the exposing mask.

12. The apparatus according to claim 11, wherein the control data and the allowable load of the exposing mask are changeable.

13. The apparatus according to claim 11, wherein the control data and the allowable load of the exposing mask are changeable by an external source via a communication section.

14. The apparatus according to claim 11, wherein when said controller determines that the present load exceeds the allowable load of the exposing mask, said controller controls a display to display that the present load exceeds the allowable load of the exposing mask.

15. The apparatus according to claim 11, wherein the opening pattern of the exposing mask comprises a micro-opening pattern.

16. The apparatus according to claim 11, wherein the control data is stored in a data table.

17. An exposure apparatus for exposing an object to be exposed by elastically deforming an exposing mask having an opening pattern so as to bring the exposing mask into contact with the object, the exposure apparatus comprising:

compression/decompression means for elastically deforming the exposing mask in a compression/decompression operation so as to bring the exposing mask into contact with the object or to effect separation of the exposing mask from the object; and controlling means for controlling said compression/decompression means to effect the compression/decompression operation, wherein said controlling means controls said compression/decompression means to effect the compression/decompression operation based on control data prepared in advance for producing a predetermined compression profile in an exposing mask contacting operation and a predetermined decompression profile in an exposing mask separating operation, wherein said controlling means compares an allowable load of the exposing mask with a present load during the compression/decompression operation, and if the present load is determined to exceed the allowable load of the exposing mask, the compression/decompression operation is stopped, and wherein when said controlling means determines that the present load exceeds the allowable load of the exposing mask, said controlling means controls displaying means to display that the present load exceeds the allowable load of the exposing mask.

18. The apparatus according to claim 17, wherein the allowable load of the exposing mask is within at least one of a predetermined range of the elastic deformation of the exposing mask and a range that would avoid a natural frequency of the exposing mask.

19. The apparatus according to claim 17, wherein the control data and the allowable load of the exposing mask are changeable.

20. The apparatus according to claim 17, wherein the control data and the allowable load of the exposing mask are changeable by an external source via communication means.

21. The apparatus according to claim 17, wherein the opening pattern of the exposing mask comprises a micro-opening pattern.

22. The apparatus according to claim 17, wherein the control data is stored in a data table.

23. An exposing method comprising the steps of:

providing an exposure apparatus, having an exposure light source, an exposing mask, and a pressure regulating vessel for holding the exposing mask, for exposing an object to be exposed by controlling the pressure in the pressure regulating vessel so as to elastically deform the exposing mask and to bring the exposing mask into a contact state with the object; and controlling the contact state between the exposing mask and the object by a compression/decompression operation of the pressure regulating vessel, wherein (i) the compression/decompression operation is performed based on control data prepared in advance for producing a predetermined compression profile in an exposing mask contacting operation and a predetermined decompression profile in an exposing mask separating operation, (ii) an allowable load of the exposing mask is compared with a present load during the compression/decompression operation, and (iii) if the present load is determined to exceed the allowable load of the exposing mask, the compression/decompression operation is stopped, and wherein when the present load is determined to exceed the allowable load of the exposing mask, said controlling step controls a display to display that the present load exceeds the allowable load of the exposing mask.

24. The method according to claim 23, wherein the control data is stored in a data table.

25. The method according to claim 23, wherein the allowable load of the exposing mask is within at least one of a predetermined range of the elastic deformation of the exposing mask and a range that would avoid a natural frequency of the exposing mask.

26. The method according to claim 23, further comprising the step of changing the control data and the allowable load of the exposing mask.

27. An exposure apparatus for exposing an object to be exposed by elastically deforming an exposing mask having an opening pattern so as to bring the exposing mask into contact with the object, the exposure apparatus comprising:

a pressure regulating vessel that elastically deforms the exposing mask in a compression/decompression operation so as to bring the exposing mask into contact with the object or to effect separation of the exposing mask from the object; and a controller that controls said pressure regulating vessel to effect the compression/decompression operation, wherein said controller controls said pressure regulating vessel to effect the compression/decompression operation based on control data prepared in advance for producing a predetermined compression profile in an exposing mask contacting operation and a predetermined decompression profile in an exposing mask separating operation, said controller compares an allowable load of the exposing mask with a present load during the compression/decompression operation, and if the present load is determined to exceed the allowable load of the exposing mask, the compression/decompression operation is stopped, and wherein when said controller determines that the present load exceeds the allowable load of the exposing mask, said controller controls a display to display that the present load exceeds the allowable load of the exposing mask.

28. The apparatus according to claim 27, wherein the allowable load of the exposing mask is within at least one of a predetermined range of the elastic deformation of the exposing mask and a range that would avoid a natural frequency of the exposing mask.

29. The apparatus according to claim 27, wherein the control data and the allowable load of the exposing mask are changeable.

30. The apparatus according to claim 27, wherein the control data and the allowable load of the exposing mask are changeable by an external source via a communication section.

31. The apparatus according to claim 27, wherein the opening pattern of the exposing mask comprises a micro-opening pattern.

32. The apparatus according to claim 27, wherein the control data is stored in a data table.

* * * * *